US005610520A

United States Patent [19]

Misic

[11] Patent Number: 5,610,520
[45] Date of Patent: Mar. 11, 1997

[54] AUTOMATIC ORTHOGONALITY ADJUSTMENT DEVICE FOR A QUADRATURE SURFACE COIL FOR MAGNETIC RESONANCE IMAGING OR SPECTROSCOPY

[75] Inventor: George J. Misic, Novelty, Ohio

[73] Assignee: Medrad Inc., Pittsburgh, Pa.

[21] Appl. No.: 201,862

[22] Filed: Feb. 24, 1994

[51] Int. Cl.[6] ............................. G01V 3/00; G01V 3/14
[52] U.S. Cl. ........................................ 324/318; 324/322
[58] Field of Search ................................ 324/318, 319, 324/322, 300, 314; 364/413.13

[56]       References Cited

U.S. PATENT DOCUMENTS

| | | |
|---|---|---|
| 4,467,282 | 8/1984 | Siebold . |
| 4,712,069 | 12/1987 | Kemner et al. . |
| 4,721,913 | 1/1988 | Hyde et al. . |
| 4,763,074 | 8/1988 | Fox ............................... 324/318 X |
| 4,816,765 | 3/1989 | Boskamp . |
| 4,820,985 | 4/1989 | Eash ............................... 324/318 |
| 4,918,388 | 4/1990 | Mehdizadeh et al. . |
| 5,041,790 | 8/1991 | Tropp ............................ 324/318 |
| 5,202,634 | 4/1993 | Potthast ........................ 324/322 |
| 5,221,901 | 6/1993 | Derke ............................ 324/318 |
| 5,394,087 | 2/1995 | Molyneaux ................... 324/318 |
| 7,752,736 | 6/1988 | Arakawa et al. . |

*Primary Examiner*—Sandra L. O'Shea
*Assistant Examiner*—Mack Haynes
*Attorney, Agent, or Firm*—Keck, Mahin & Cate

[57]       ABSTRACT

An MRI/MRS magnetic coil system is disclosed wherein the isolation between the coils can be adjusted to decrease or virtually eliminate the coupling between quadrature magnetic resonance imaging coils in order to optimize orthogonality between the coils. The adjustment allows the use of flexible coils which may be conformed to image specific anatomical regions. The RF characteristics of the coils are controlled by variable capacitors. The capacitors are controlled by a remote automatic controller which functions to adjust the RF characteristics of the coils until an optimal orthogonality and signal to noise ratio is achieved between and by the coils.

28 Claims, 6 Drawing Sheets

AUTOMATIC ORTHOGONALITY ADJUSTMENT DEVICE FOR A QUADRATURE SURFACE COIL FOR MAGNETIC RESONANCE IMAGING OR SPECTROSCOPY

FIELD OF INVENTION

This invention relates to a quadrature coil for magnetic resonance imaging ("MRI") and/or spectroscopy ("MRS"). Specifically this invention relates to a method and apparatus for the electrical adjustment of at least two magnetic resonance coils to assure the proper tuning and orthogonal relationship of the coil fields in order to increase the signal to noise ratio of the magnetic resonance signal.

BACKGROUND OF INVENTION

Quadrature magnetic resonance imaging coils, and more recently, multicoil systems using a plurality of independent data acquisition channels, are generally known in the art. Quadrature magnetic resonance systems offer advantages over previous magnetic resonance imaging techniques in that they provide a better signal to noise ratio by using both component vectors of the circularly polarized field of the magnetic resonance phenomenon, and lower RF transmitter power requirements when used as transmit coils. Multicoil systems offer some or all of the above-noted advantages, plus additional advantages in enhancing the imaging signal to noise ratio due to the reduced imaging volume of each independent coil and data acquisition path in the multicoil system. However, when these systems are used for magnetic resonance imaging, the isolation of the signal currents in one coil mode or coil system from currents in the other mode or coil system must be at a high level to obtain the benefits of quadrature operation, or multicoil operation.

Those skilled in the art will appreciate that it is desirable to reduce or eliminate the inductive coupling between the two coil systems forming the RF quadrature coil used in a magnetic resonance imaging system in order to solve these and other problems. Additionally, it is desirable to reduce or eliminate the inductive coupling between the various coil systems in a multicoil configuration. Ideally there should be no inductive coupling between the coil systems comprising the RF quadrature coil or multicoil system. Previously the adjustment of such coils to minimize the coupling between the coils was accomplished by either the physical movement of the coils or the physical adjustment of a variable element to electrically accomplish the same result.

Changing a single element generally alters the tuning or other coil parameters. In the past, adjusting the isolation or orthogonality of a coil has yielded undesirable manual secondary adjustment of one or more other coil parameters. Further, if physical adjustment of the location of the coils is employed to accomplish this result, many coil formations are eliminated as a practical matter, thereby dramatically decreasing the versatility of these systems.

Providing optimum orthogonality adjustment is required to improve the signal to noise ratio of MRI and MRS signals. Furthermore, such an adjustment is essential in order to implement more flexible, and anatomically conformal MR coils operating in quadrature and/or multi-coil modes. Also, flexible surface coils impart advantages in filling factor and patient comfort; however, the variability of the coil geometry generally precludes the use of the quadrature technique due to the loss of defined geometry. Thus a need exists for a mechanism to provide optimal tuning and orthogonality adjustment to improve the signal to noise ratio of MRI and or MRS signals for flexible and variable quadrature coil configurations.

SUMMARY OF INVENTION

It is therefore an object of the present invention to provide optimum orthogonality adjustment to improve signal to noise ratio in a coil MRI system.

Another object of the present invention is to permit flexible and variable quadrature coil configurations for imaging selected anatomical regions.

Still another object of the present invention is to provide a quadrature magnetic resonance coil that may be tuned automatically to provide optimal orthogonality adjustment.

These and other objects may be realized in the present invention, which consists of a quadrature surface coil system having first and second flexible coil systems designed to operate in quadrature and covering largely the same imaging area. The net magnetization vector of the second coil is at an approximate right angle to the net magnetization vector of the first flexible coil. First and second variable capacitors contribute a first RF value in series with the first flexible coil and a variable capacitor contributes a third RF value in series with the second coil. The variable capacitors are operable to change the RF values of the first and second coils such that optimum tuning and orthogonality are achieved.

According to another aspect of the invention, a surface coil system is provided which is capable of being operated in quadrature, and which consists of a first and second coil. The first and second coils can be either flexible or rigid, and can be of any of several types, and further can be types which are different from each other. The first and the second coils are adapted to be positioned adjacent a region of interest in the subject for intercepting a magnetic field of a predetermined radio frequency, such that the net magnetization vector of the first and second coils at that frequency are at approximate right angles to each other. A signal source is operable to be selectively coupled to the first coil for inputting a test signal of the predetermined radio frequency. A reflection sensor is operable to be coupled to a selected one of the first and second coils and to the signal source for sensing the matching of impedance of the signal source to each of the first and second coils. An orthogonality sensor, preferably an RF level detector, is operable to be coupled to the second coil while the signal source is coupled to the first coil for sensing the degree of orthogonality of a signal on the first coil with respect to a signal on the second coil. First and second variable capacitors, which may for example be varactor diodes, are coupled to the first coil, and a third variable capacitor (also preferably a varactor diode) is coupled to the second coil. A controller is coupled to the reflection sensor, the orthogonality sensor and the first, second and third variable capacitors, and is operable to vary the capacitance in the first, second and third variable capacitors to match the impedance of the first and second coils at the predetermined frequency, and to optimize the orthogonality of the signals appears on the first and second coils.

The tuner operates by connecting its internal signal source to a reflectometer with the signal port of the first coil as the load. The controller adjusts the voltage applied to the first and second varactor diodes until the value of reflection, represented by the parameter S11, is minimized.

The controller then connects its internal signal source to the reflectometer, with the signal port of the second coil as the load. The controller adjusts the common mode voltage applied to the third diode of the second coil until S11 is minimized. The controller then connects its internal signal source to the signal port of the first coil and connects the RF level detector to the signal port of the second coil. The controller adjusts the differential mode voltage applied to the first and second varactor diodes on the first coil until the value of the orthogonality parameter S21 is minimized. These steps are repeated until an optimal setting is achieved. The controller then connects the signal ports of the coils to the host magnetic resonance system.

The present invention confers a principal technical advantage in that the or magnetic field isolation of RF quadrature coils can be precisely adjusted and optimized for various different configurations of coils. This allows optimal imaging for different anatomical regions. The present invention has applications in many different types of quadrature magnetic resonance surface coils and/or multicoil systems.

BRIEF DESCRIPTION OF THE DRAWINGS

The present invention may be better understood with reference to the detailed description in conjunction with the following figures where like numerals denote identical elements.

DETAILED DESCRIPTION OF THE PREFERRED EMBODIMENT

The invention consists of a quadrature surface coil having two coil systems designed to operate in quadrature and covering largely the same imaging area, and a device that is capable of both tuning each of the two quadrature modes of the coil, and then optimizing the isolation between the modes by changing variable capacitance or reactance elements such as variable capacitors. In the preferred embodiment, the variable elements are varactor diodes.

Figure 1:
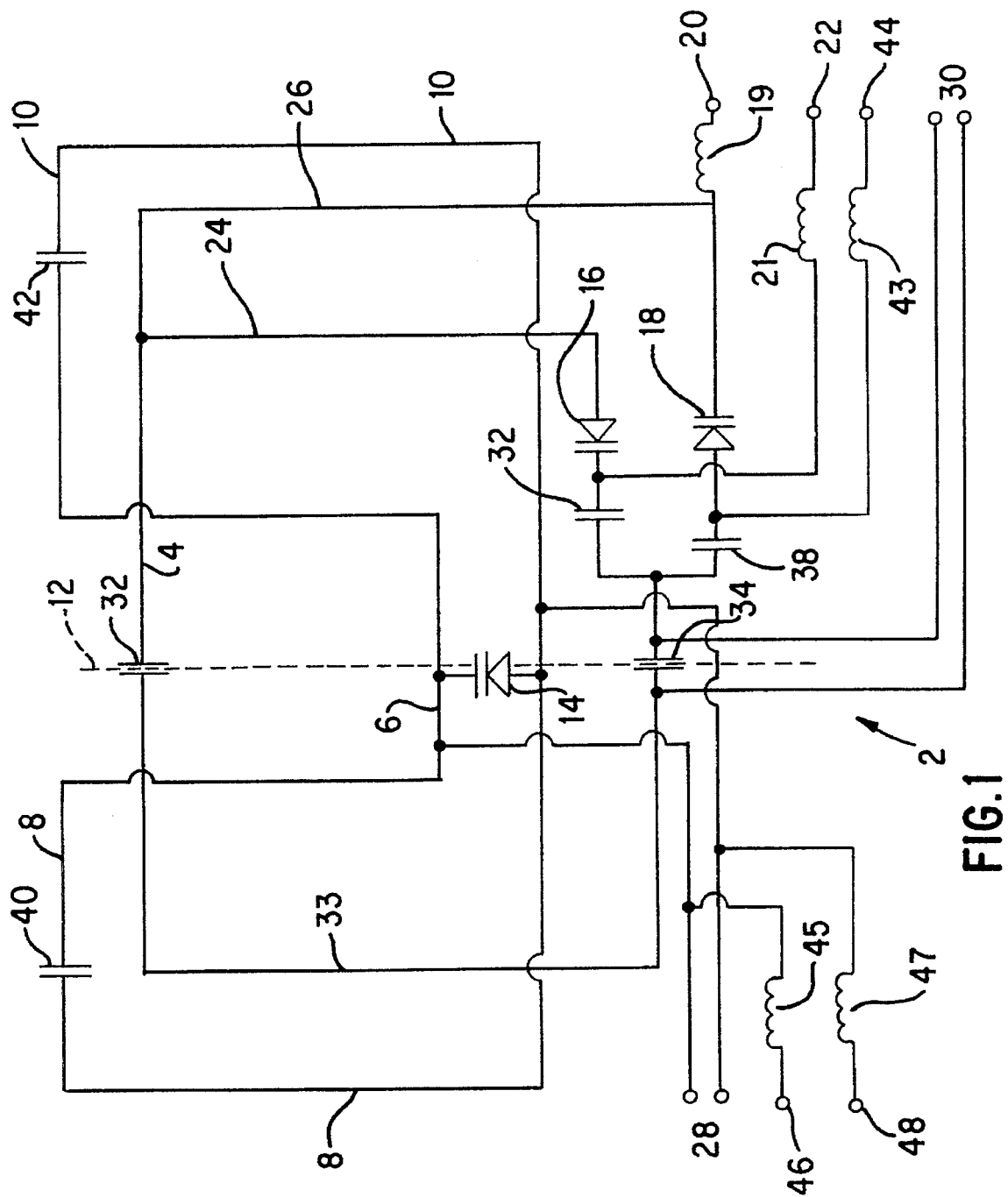
FIG. 1 is an electrical schematic diagram of a surface coil configuration of a first embodiment of the present invention, showing use with a single-loop coil and a double-loop coil.

The invention is best understood with reference to FIG. 1 which shows a specific embodiment of the present invention for purposes of illustration. FIG. 1 shows the electrical diagram of a preferably flexible coil indicated generally at 2. The flexible coil 2 may be used for MRI or MRS imaging.

The flexible coil 2 is composed of two separate coil systems, a single loop coil 4, and a double loop coil 6. Both single loop coil 4 and double loop coil 6 are fitted within a flexible plastic housing (not shown) having a length and width appropriate for holding a patient. The plastic housing in conjunction with the coils 4 and 6 permits imaging of a variety of anatomical regions. The coils 4 and 6 have mirror symmetry about a center line 12 when placed on a flat surface. The shape of the two coils 4 and 6 allows the coils 4 and 6 and the flexible housing to be wrapped about the anatomical region of interest on a patient. The position of the two coils 4 and 6 about the anatomical region of interest is such to cause the net magnetization vector corresponding to each coil 4 and 6 to be at approximate right angles.

An orthogonality input 20 is connected to an inductor 19. A tune control input 22 is connected to an inductor 21. A common voltage return 44 is connected to an inductor 43. The output signal which is emitted from single loop coil 4 is output from a signal port 30. The tune control input 22 is connected to the cathode of a varactor diode 16. The anode of the varactor diode 16 is connected to one end of a parallel conductor 24. The other end of the parallel conductor 24 is connected to the capacitor 32 and one end of a parallel conductor 26. The other end of the parallel conductor 26 is connected to the cathode of the varactor diode 18 and the orthogonality control input 20. The capacitor 32 is connected to a single-conductor segment 33 of the single loop coil 4 which is also connected to the capacitor 34 and the signal port 30.

A tune control input 46 of double loop coil 6 is connected to an inductor 45. A common voltage return 48 of double loop coil 6 is connected to an inductor 47. The output signal which is emitted from double loop coil 6 is output from a signal port 28. The tune control input 46 is connected to one of the outputs of the signal port 28 and the cathode of a varactor diode 14. The anode of the varactor diode 14 is coupled to the other output of the signal port 28 and the common voltage return 48. A first loop 8 of double loop coil 6 begins at the cathode of the varactor diode 14, includes the capacitor 40 and ends at the anode of the varactor diode 14. Similarly, a second loop 10 of double loop coil 6 begins at the cathode of the varactor diode 14, includes the capacitor 42 and ends at the anode of the varactor diode 14.

The varactor diode 14 contained in the double loop coil 6 is capable of tuning the double loop coil 6 to exact resonance at the desired operating frequency by changing the RF characteristics of the loop coil 4. The single loop coil 6 is configured so that adjusting both of the varactor diodes 16 and 18 in a common mode manner by changing the voltage at the tune control input 22 adjusts the single loop coil 4 to exact resonance at the desired operating frequency. Adjusting both the varactor diodes 16 and 18 in a differential mode at the orthogonality control input 20 changes the effective placement of the single loop coil 4 relative to the double loop coil 6 by changing the relative current levels in the two parallel conductors 24 and 26 displaced in space thus enabling the orthogonality or isolation of the fields from the two coil loops 4 and 6 to be adjusted. The balance of the coil design follows methods and techniques well known persons skilled in the MRI/MRS art.

An S11 transmission parameter measurement taken at output 30 or 28 can be used to correct the tuning of each coil system corresponding to each mode of the quadrature coil system. An S21 transmission parameter measurement from node 28 to node 30 may then be used as a criterion to optimize the isolation of single loop coil 4 from the double loop coil 6 to provide idealized quadrature operation for any arbitrary final geometry of the flexible coil package. Included within the tuning/orthogonality device architecture may be a means to perform several iterations due to the interactive nature of the adjustments, as will be hereinafter described.

Tuning of the double loop coil system 6 can be readily accomplished by using an S11 transmission parameter measurement of the coil system's output impedance at the signal port 28, and incrementing the voltage applied to the varactor diode 14 tuning the double loop coil 6 to optimize the tuning by determining the voltage level corresponding to the best impedance match as indicated by a minimizing of the S11 parameter.

Tuning of the single loop coil system 4 may also be readily accomplished by using a similar S11 measurement of the coil system's output impedance at the signal port 30, and incrementing the common mode voltage applied to the varactor diodes 16 and 18 at input 22 to optimize the tuning by determining the total common mode voltage level corresponding to the best impedance match as indicated by a minimizing of the S11 parameter.

The quadrature isolation or orthogonality may then be optimized by measuring the magnitude of the S21 transmission parameter from either the signal port 28 or the signal port 30 of one coil system of the quadrature coil to the other. Adjustment of the embodiment shown in FIG. 1 is achieved by adjusting the differential mode voltage on the two varactor diodes 16 and 18 on the single loop coil 4 at the orthogonality control input 20 to minimize the S21 parameter which represents the transmission of the signal from one coil system to the other.

Figure 2:
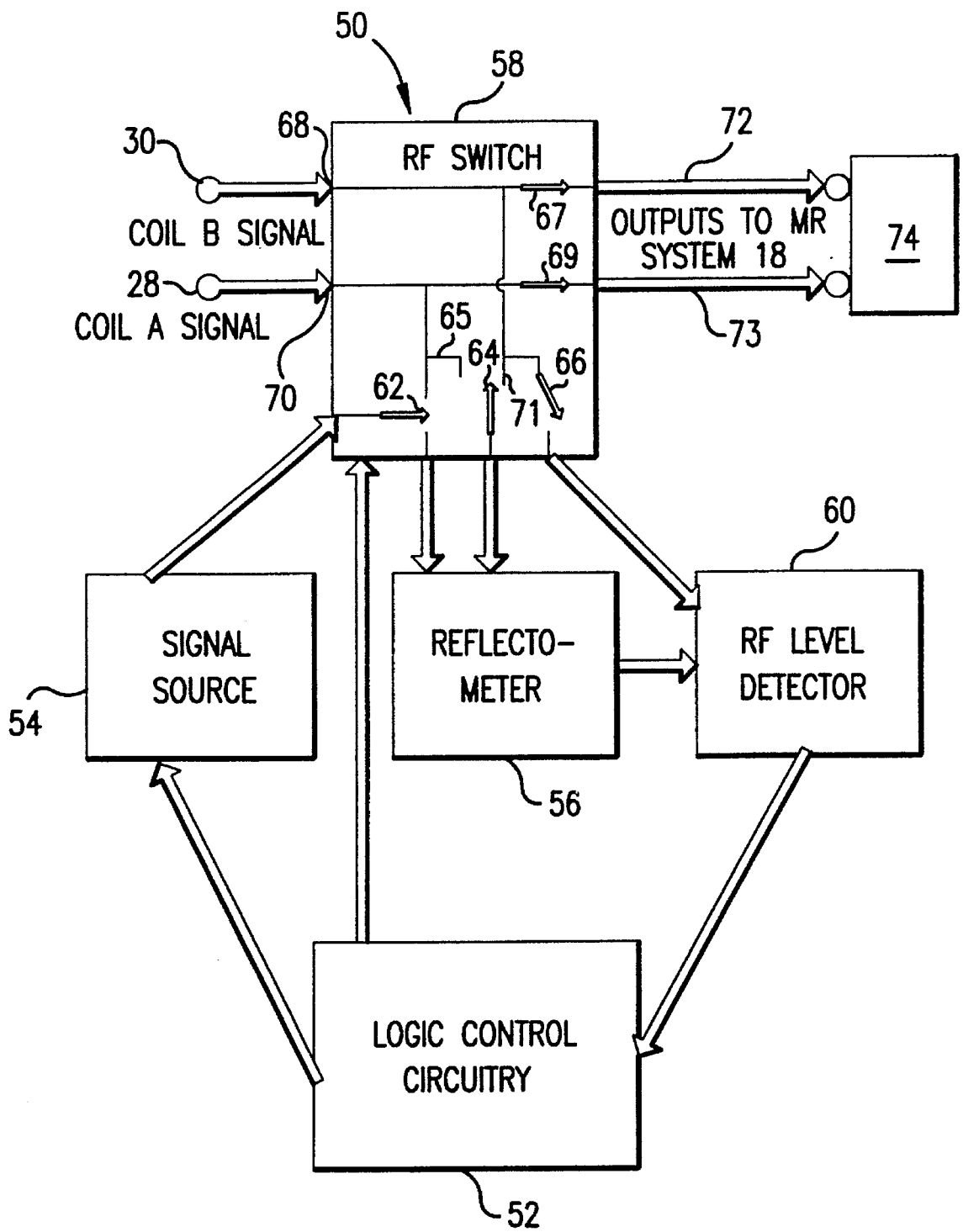
FIG. 2 is an block diagram of the automatic tuning device attached to the coil configuration of FIG. 1.

The hardware in the embodiment shown in FIG. 1 for making the above described adjustments consists of the two coils 4 and 6 and an automatic tuning device indicated generally at 50 in FIG. 2. The automatic tuning device 50 has a controller or logic control circuitry 52, an internal signal source 54, a reflectometer 56, an RF switch 58 and an RF level detector 60. The internal signal source 54 is designed to provide an RF signal source to measure the RF response of the coil on a scan subject at a predetermined frequency and amplitude. The controller 52 coordinates the operation of the automatic tuning device 50. The controller 52 may be a microprocessor or a dedicated integrated circuit which is capable of controlling the components of the automatic tuning device 50. The controller 52 is connected to switches 62, 64, 66, 67 and 69 which are contained in RF switch 58. The switches 62, 64, 66, 67 and 69 are preferably PIN diode switches. The controller 52 also has a control input connected to the signal source 54. The reflectometer 56 is connected to the RF level detector 60. The controller 52 takes input data from the RF level detector 60.

The RF switch 58 has a first input 68 which is connected to the signal port 30 of the single loop coil 4. The RF switch 58 also has a second input 70 which is connected to the signal port 28 of the double loop coil 6. The RF switch 58 has outputs 72 and 73 which are coupled to a magnetic resonance system 74. Inputs 30 and 28 may be selectively connected to outputs 72 and 73, respectively, by switches 67 and 69; these switches would be open during the operation of internal signal source 54.

The signal source 54 is connected to one end of the switch 62. The switch 62 may connect the output of the signal source 54 to either the second input 70 or an input of the reflectometer 56. The switch 64 connects the input of the reflectometer 56 to either the first input 68 or the second input 70 of the RF switch 58, or to neither. The switch 66 establishes a connection between the first input 68 and the RF level detector 60. The switches 62, 64, and 66 are all controlled by the controller 52.

Figure 3:
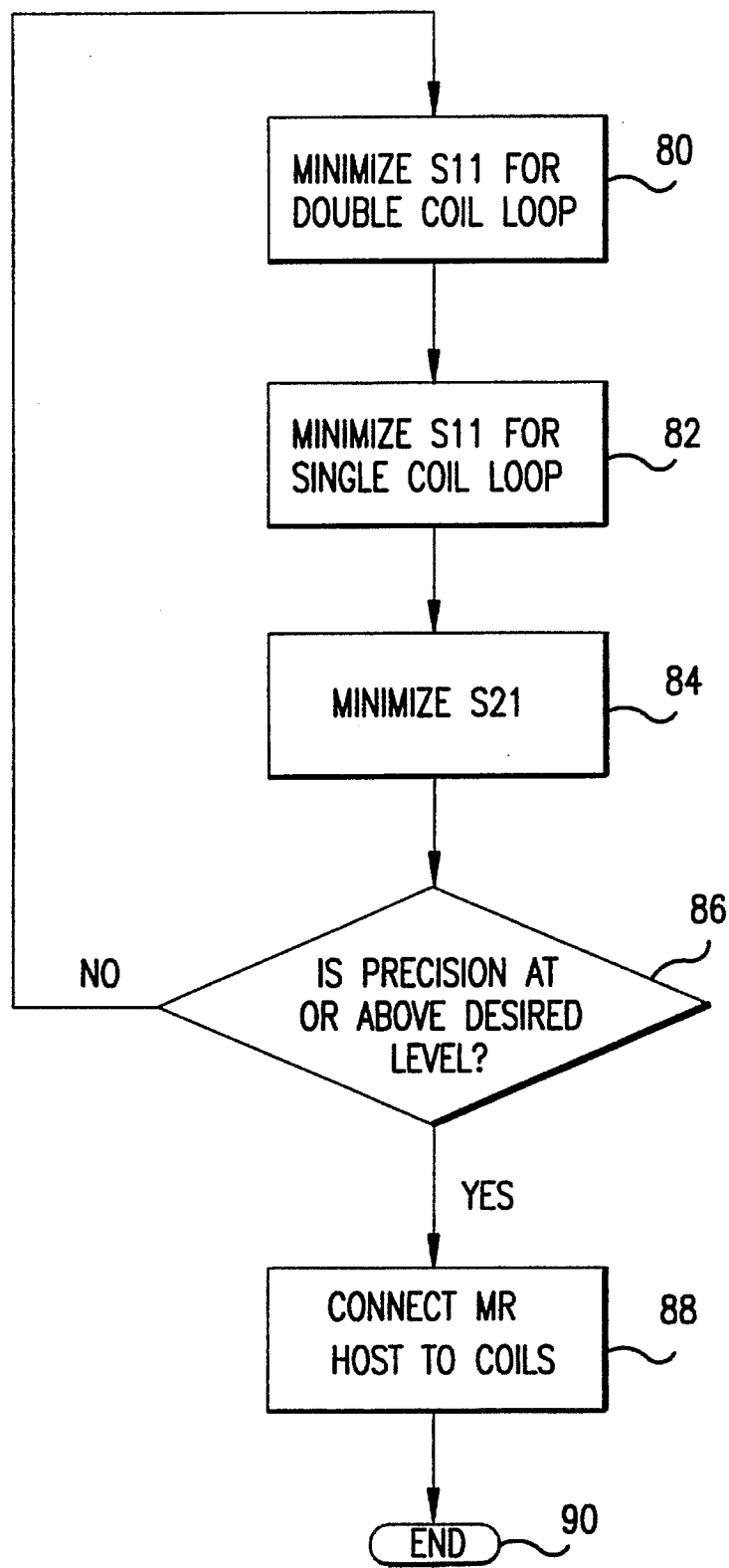
FIG. 3 is a flow diagram of the process used by the automatic tuning device to achieve an optimal orthogonality adjustment.

One method of using the automatic tuning device 50 is illustrated in the flow diagram of FIG. 3 as follows. The method may be programmed into a microprocessor which may be used for the controller 52. As shown in block 80, and with continued reference to FIG. 2, the controller 52 in the automatic tuning device 50 connects the internal signal source 54 to the reflectometer 56 via the switch 62 of the RF switch 58. Switch 64 is closed to node 65, connecting the signal port 28 of the double loop coil 6 as the load. The controller 52 adjusts the voltage applied to the varactor diode 14 (FIG. 1) in the double coil loop 6 until the value of reflection as determined from the output of the RF level detector 60 from reflectometer 56, and as represented by the S11 transmission parameter, is minimized.

After block 80 is performed the controller 52 continues to block 82 where the controller 52 connects its internal signal source 54 to the reflectometer 56. Switch 64 is closed to node or terminal 71 to use the single loop coil 4 as the load. The controller 52 adjusts the common mode voltage applied to the two varactor diodes 16 and 18 in the single loop coil 4 until the value of reflection as determined from the output of the RF level detector 60, and as represented by the S11 transmission parameter, is minimized.

The controller 52 then proceeds to block 84 where it connects its internal signal source 54 via the switch 62 to node 65, thereby using the double loop coil 6 as the load. The RF level detector 60 is connected via the switch 66 to the signal port 30 of the single loop coil 4, thereby connecting the single loop coil 4 as the signal source. The controller 52 adjusts the differential mode voltage applied to the two varactor diodes 16 and 18 on the single loop coil 4 until the value of the S21 transmission parameter is minimized.

The controller 52 then reaches decision block 86. The above three steps are repeated by the controller 52 until no additional improvement can be obtained, or until the precision of tuning and orthogonality adjustment reaches some predetermined threshold which may be programmed into the controller 52 by the user.

After an optimal level has achieved in tuning and orthogonality, the controller 52 in the automatic tuning device 50 disables its internal signal source 54 via the switch 62 as shown in block 88. The controller 52 then switches the outputs of the coils 4 and 6 to the inputs of the magnetic resonance system 74 via switches 67 and 69 in the RF switch 58, thus ending the adjustment process as shown in block 90. This is accomplished either through independent quadrature inputs, or through a combining circuit and into a singular input on the host MR system 74.

It should be clear from the above description that the basic principle described here can be applied to a large variety of quadrature coil systems, and also to multicoil systems with a plurality of unrelated receiver channels and reconstruction means. For example the present invention may be used with the following quadrature coil configurations.

a. Quadrature coil systems containing two coils each of a single loop design.

b. Quadrature coil systems containing two coils each of a complex design, including but not limited to saddle coils, birdcage coils, Helmholtz coil pairs, and combinations of the above coils.

c. The above two configurations in a flexible package, a conformal package, or a rigid package.

d. Multiple coil systems containing two or more coils each of a single loop design.

e. Multiple coil systems containing two or more coils each of a complex design, including but not limited to saddle coils, birdcage coils, Helmholtz coil pairs, and combinations of the above coils.

f. Any of the above multiple coil systems in a flexible package, a conformal package, or a rigid package.

g. Multiple quadrature coil systems containing two or more coils each of a single loop design.

h. Multiple quadrature coil systems containing two or more coils each of a complex design, including but not limited to saddle coils, birdcage coils, Helmholtz coil pairs, and combinations of the above coils.

i. Any of the above multiple quadrature coil systems in a flexible package, a conformal package, or a rigid package.

Several coil systems which incorporate the present invention in certain of the configurations described above are show in FIGS. 4–8.

Figure 4:
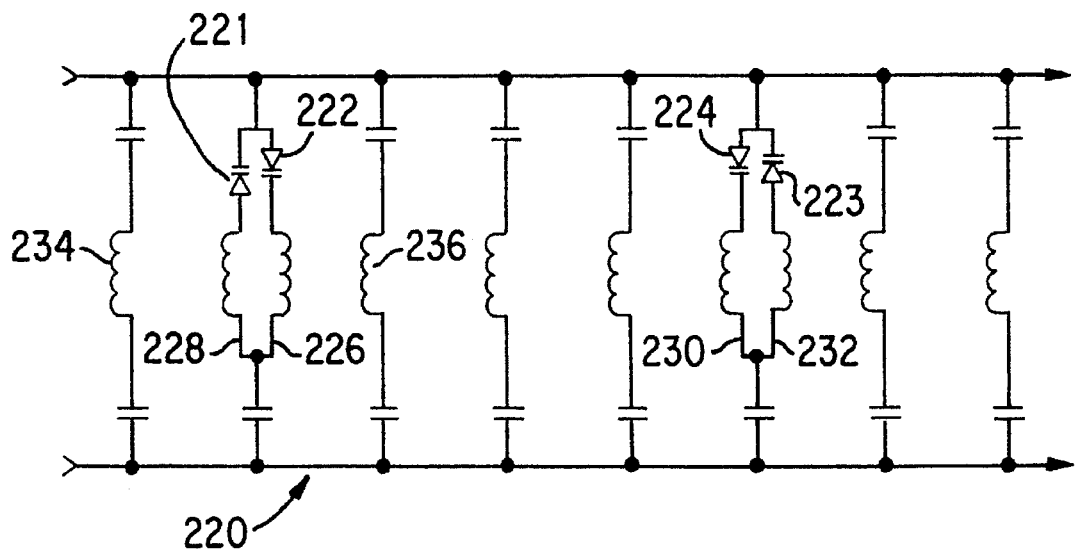
FIG. 4 is an electrical diagram of an application of the present invention to a quad birdcage coil.

FIG. 4 shows an application of the present invention to a quad birdcage coil shown generally at 220. A pair of varactor diodes 221 and 222 are operable to change the RF characteristics of a first coil loop with parallel segments 226 and 228. Similarly a pair of varactor diodes 223 and 224 are operable to change the RF characteristics of a second coil loop with parallel segments 230 and 232. Each pair of varactor diodes may be independently tuned as previously discussed to provide the desired isolation of the coils. First and second outputs are available to a tuner similar to that described above across inductors 234 and 236, respectively.

Figure 5:
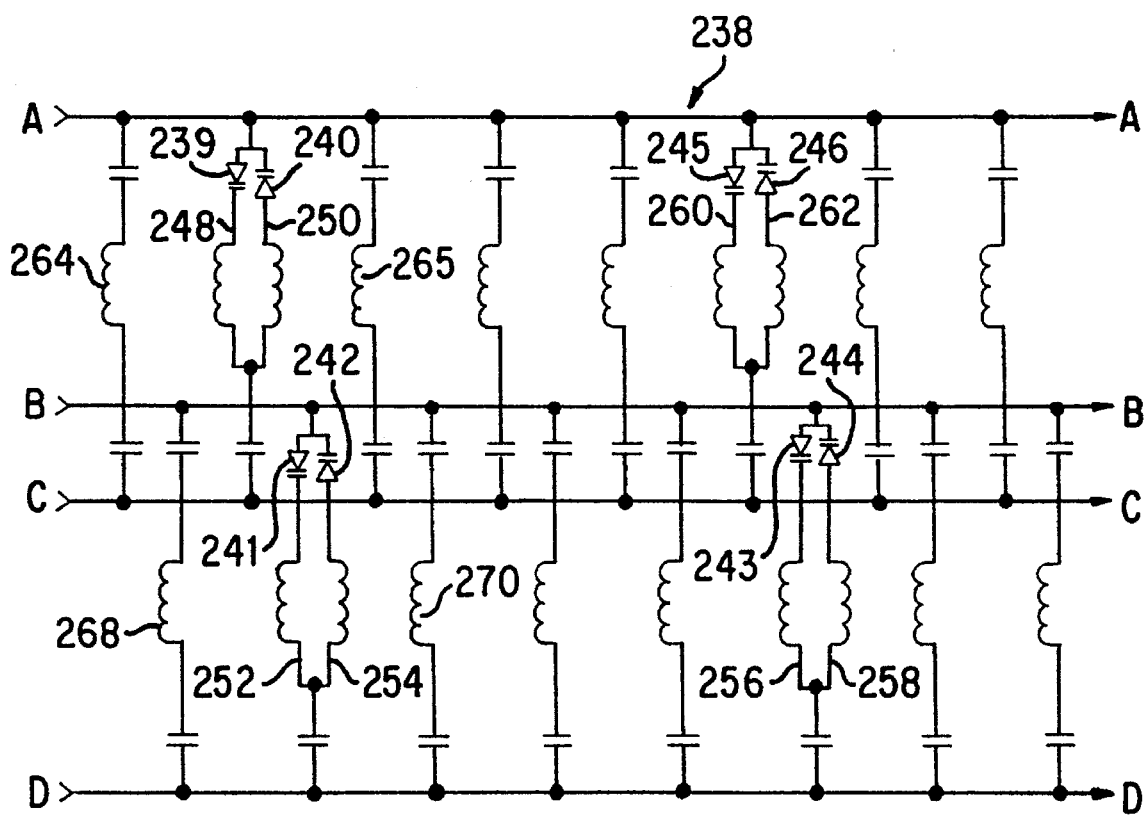
FIG. 5 is a electrical diagram illustrating the application of the present invention to a quad multiple port birdcage coil.

FIG. 5 is a schematic diagram illustrating the application of the present invention to a quad multiple port birdcage coil shown generally at 238. In this example four pairs of varactor diodes 239, 240; 241, 242; 243, 244; and 245, 246 are employed to provide the desired isolation of respective coil pairs. Each of pair of varactor diodes is connected to respective parallel segments 248, 250; 252, 254; 256, 258; and 260, 262 to provide for the adjustment of the RF current flowing through the respective paths as previously discussed. As with the other designs it is contemplated that in one embodiment the pairs of varactor diodes may be replaced with other types of remotely adjustable variable capacitance devices. Output coils 264 and 266 are provided in conjunction with parallel segments 248 and 250. Output coils 268 and 270 are provided in conjunction with parallel segments 252 and 254.

Figure 6:
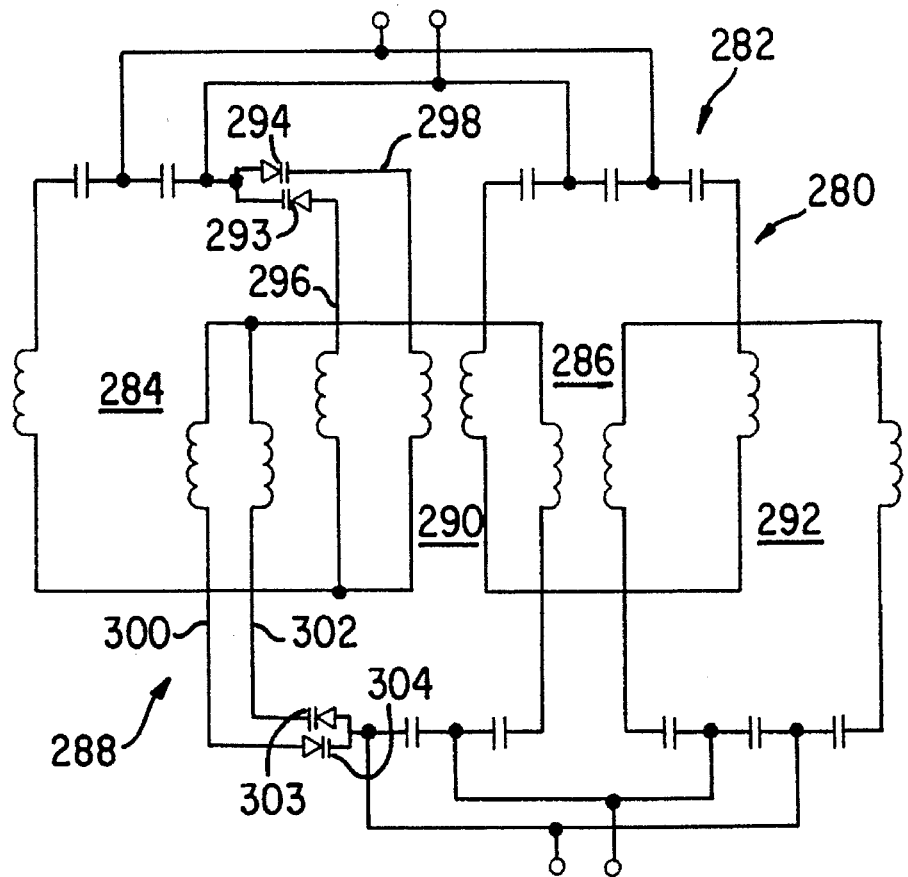
FIG. 6 is a electrical diagram illustrating the application of the present invention to a quad saddle coil.

FIG. 6 is a schematic electrical diagram illustrating the application of the present invention to a quad saddle coil design shown generally at 280. A first saddle coil 282 has coil halves 284 and 286. A second saddle coil 288 has coil halves 290 and 292. A pair of varactor diodes 293 and 294 are connected to loop segments 296 and 298 respectively, which overlap with loop segments 300 and 302 of coil half 290 of second saddle coil 288. A second pair of varactor diodes 303 and 304 are connected to loop segments 300 and 302 respectively to increase the tunable range of the coils. In this arrangement, the varactor diodes may be replaced with variable capacitance devices.

Figure 7:
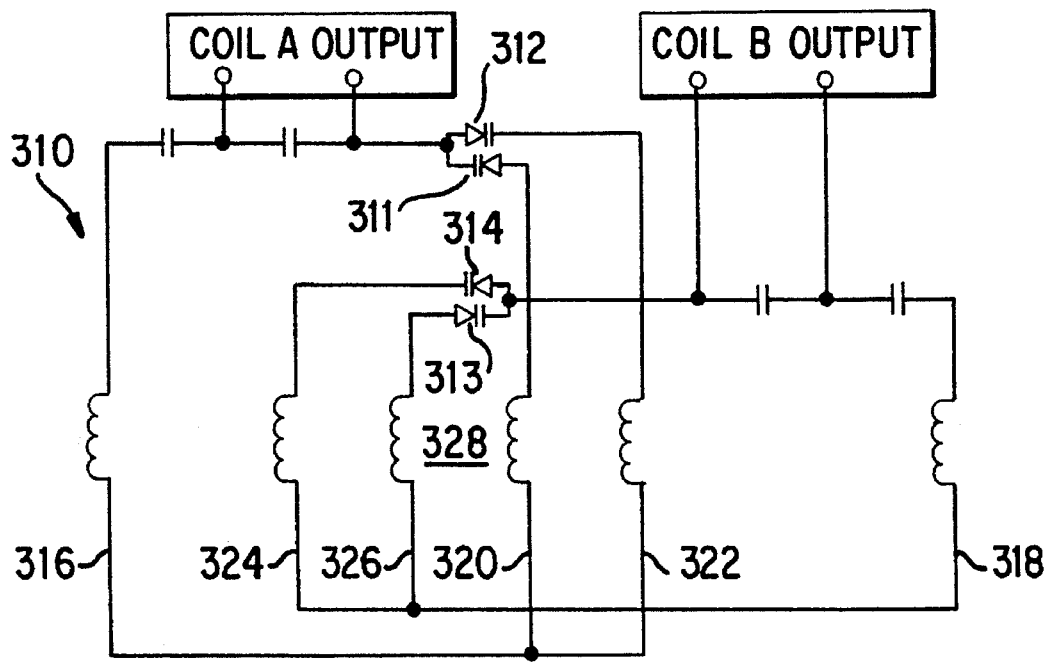
FIG. 7 is a electrical diagram illustrating the present invention embodied in a multiple port planar coil.

FIG. 7 is a schematic diagram illustrating the present invention embodied in a multiple port planar coil shown generally at 310. The diagram illustrates two pairs of varactor diodes 311, 312 and 313, 314 respectively located in line with separate, overlapping coils 316 and 318. Coil 316 is separated into parallel segments 320 and 322. Coil 318 is formed with parallel segments 324 and 326. Segments 320–326 are located within a critically overlapped area 328. The pairs of varactor diodes 311, 312 and 313, 314 operate in a manner identical to that previously discussed and may be formed by other types of variable capacitance devices.

Figure 8:
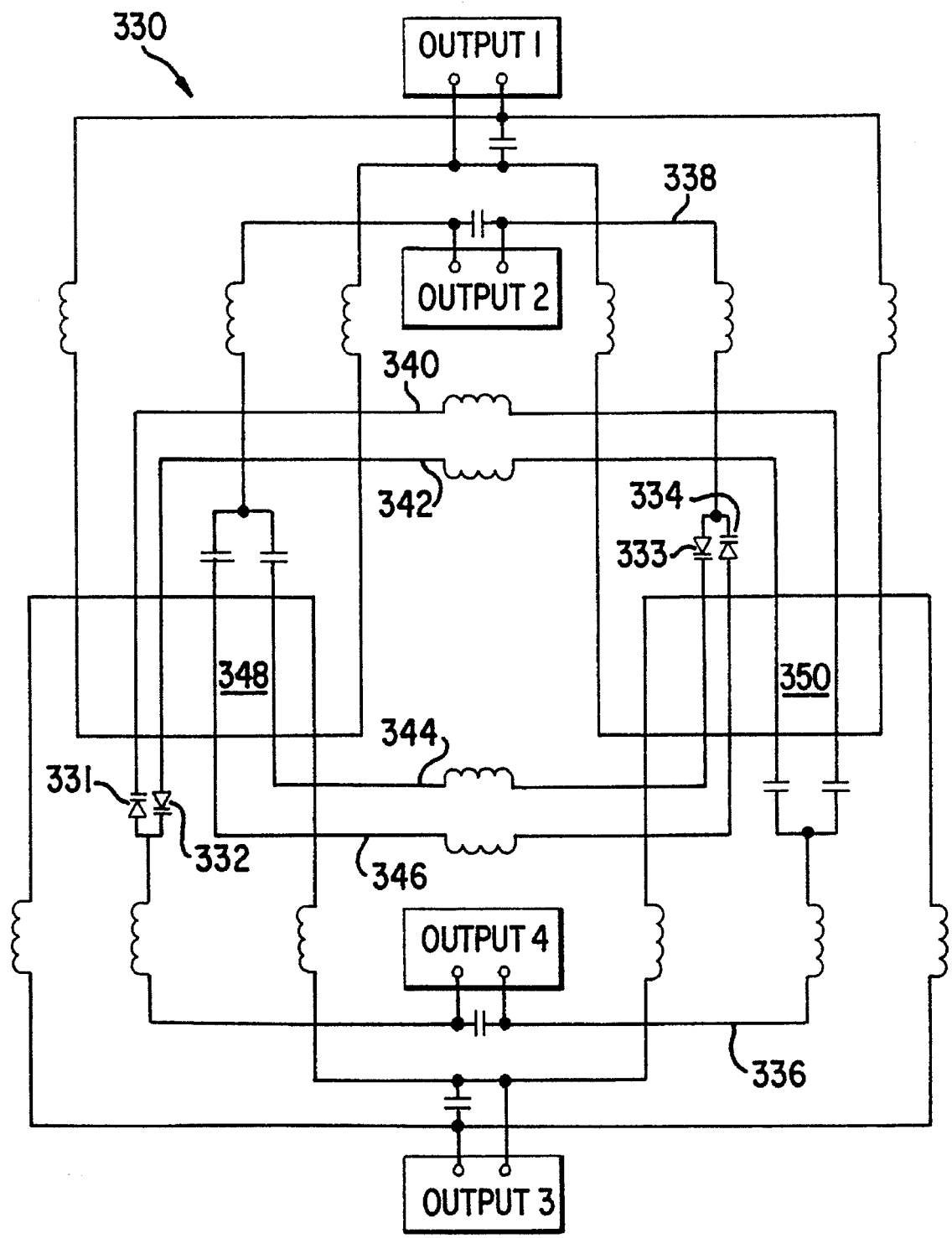
FIG. 8 is a electrical diagram illustrating the application of the present invention to a quadrature planar multiport coil.

FIG. 8 is a schematic diagram illustrating the application of the present invention to a quadrature planar multiport coil shown generally at 330. In this example two pairs of varactor diodes 331, 332 and 333, 334 are employed to provide the desired isolation of respective coil pairs 336 and 338. Each of the pairs of varactor diodes 331, 332 and 333, 334 are connected in series to respective parallel segments 340, 342 and 344, 346 to provide for the adjustment of the RF current ratio flowing through the respective paths as previously discussed. As with other designs, it is understood that more or fewer pairs of parallel segments in the critically overlapped areas 348, 350 can be used to increase the flexibility of orthogonality and isolation adjustment available. Also as with the other designs it is contemplated that the pairs of varactor diodes may be replaced with other variable capacitance devices.

The aforementioned description is not to be interpreted to exclude other coil and transmitter arrangements advantageously employing the present invention. The above described quadrature coil is merely an illustrative embodiment of the principles of this invention. Other arrangements and advantages may be devised by those skilled in the art without departing from the spirit and scope of the invention. Accordingly, the invention should be deemed to be limited to the above detailed description but only by the spirit and scope of the claims which follow.

What is claimed is:

1. A tunable magnetic resonance quadrature coil system, comprising:

a first coil;

a second coil disposed with respect to said first coil such that a net magnetization vector of said second coil is at an approximate right angle to a net magnetization vector of said first coil;

first and second variable capacitors contributing a first RF value connected in series with said first coil and a third variable capacitor contributing a second RF value connected in series with said second coil, said variable capacitors operable to change the RF values of said first and second coils; and a tuner communicating with the first, second and third variable capacitors for automatically tuning the first and second coils, and for automatically optimizing the magnetic field isolation of the first and second coils.

2. The tunable magnetic resonance quadrature coil system of claim 1, wherein said first coil is a single loop coil.

3. The tunable magnetic resonance quadrature coil system of claim 1, wherein the second coil is a double loop coil.

4. The tunable magnetic resonance quadrature coil system of claim 1, wherein the second coil is a single loop coil.

5. The tunable magnetic resonance quadrature coil system of claim 1, wherein said first and second coils are saddle coils.

6. The tunable magnetic resonance quadrature coil system of claim 1, wherein said first and second coils are birdcage coils.

7. The tunable magnetic resonance quadrature coil system of claim 1, wherein said first and second coils are Helmholtz coils.

8. The tunable magnetic resonance quadrature coil system of claim 1, wherein said tuner operates said first, second and third variable capacitors to vary said first and second RF values.

9. The tunable magnetic resonance quadrature coil system of claim 8, wherein the automatic tuner comprises:

a controller;

a RF switch having at least one input and one output, controlled by said controller and coupled to said first and second coils and said controller;

a signal source controlled by said controller and selectively coupled to said RF switch for generating a test signal of a predetermined frequency;

a reflectometer selectively coupled to said RF switch for measuring the impedance of at least one of said first and second coils; and an RF level detector selectively coupled to said reflectometer and said controller, said RF level detector operable to detect the orthogonality of a signal on said first coil with respect to a signal on said second coil.

10. The tunable magnetic resonance quadrature coil system of claim 9 further comprising a magnetic resonance system coupled to said output of said RF switch.

11. The tunable magnetic resonance quadrature coil system of claim 9 wherein the controller is a microprocessor.

12. The system of claim 9, wherein said controller further comprises means for controlling the voltages on said first and second variable capacitors in a differential mode to effect isolation adjustment and means for controlling the voltages on said first and second variable capacitors in a common mode to effect tuning.

13. The tunable magnetic resonance quadrature coil system of claim 1, wherein the first, second and third variable capacitors are varactor diodes.

14. A method for optimally adjusting the orthogonality of a magnetic resonance coil system with a first coil and second coil; a tuner having a controller coupled to the respective signal ports and tune control ports of the first and second coils; and a host magnetic resonance system coupled to the tuner; the method comprising the steps of:

using a controller, adjusting the voltage of a first variable capacitor and a second variable capacitor coupled in series with the first coil using a signal port of the first coil as a load until a value of signal reflection in said first coil representing an S11 parameter is minimized;

using the controller, adjusting the voltage of a third variable capacitor coupled in series with the second coil using a signal port of the second coil as a load until the value of signal reflection in said second coil representing the S11 parameter is minimized;

using the controller, connecting a signal source to the signal port of one of said first and second coils to use said coil as a load;

using the controller, connecting an RF level detector to the signal port of said other one of said first and second coils, to use said other coil as a signal source;

using the controller, adjusting the voltages applied to the first, second and third variable capacitors until the tuning in each of the first and second coils is optimized and a value of S21 between the first and second coils is minimized; and connecting the signal ports of said first and second coils to said host magnetic resonance system.

15. The method of claim 14, wherein said first, second and third variable capacitors are varactor diodes.

16. The method of claim 14, wherein said controller is a microprocessor.

17. The method of claim 14, wherein said steps of adjusting the voltages of the first, second and third variable capacitors, connecting a signal source to the signal port of one of said first and second coils, connecting an RF level detector to the signal port of said other one of said first and second coils, and adjusting the voltages applied to said first, second and third variable capacitors until the value of S21 is minimized are repeated until no further minimization of S11 or S21 may be obtained.

18. The method of claim 14, wherein said steps of adjusting the voltages of the first, second and third variable capacitors, connecting a signal source to the signal port of one of said first and second coils, connecting an RF level detector to the signal port of said other one of said first and second coils, and adjusting the voltages applied to said first, second and third variable capacitors until the value of S21 is minimized are repeated until a threshold of tuning and isolation adjustment is obtained.

19. The method of claim 14, wherein said first coil is flexible.

20. The method of claim 14, wherein said second coil is flexible.

21. A magnetic resonance coil system, comprising:

a first coil having first and second segments configured in parallel;

a second coil;

a first varactor diode coupled in series with said first segment and a second varactor diode coupled in series with said second segment, said first and second varactor diodes operable to vary the currents in said first and second segments;

a third varactor diode in series with said second coil and operable to vary the current in said second coil; and a tuner communicating with the first, second and third variable capacitors for automatically tuning the first and second coils, and for automatically optimizing the magnetic field isolation of the first and second coils.

22. The magnetic resonance coil system of claim 21, wherein said first, second and third varactor diodes are remotely operable to vary said currents in said first segment, said second segment, and said second coil.

23. The system of claim 22, wherein a controller is coupled to apply a first voltage to said first varactor diode and a second voltage to said second varactor diode to vary said first and second currents.

24. The system of claim 23, further comprising:

an RF switch having at least one input and one output, controlled by said controller and coupled to said first and second coils and said controller;

an internal signal source controlled by said controller and coupled to said RF switch for generating a test signal of a predetermined frequency;

a reflectometer coupled to said RF switch for sensing the degree of reflection of signals on said first and second coils; and a RF level detector coupled to said reflectometer and said controller for sensing the degree of magnetic field isolation of a signal on one of said first and second coils with respect to a signal on the other one of said first and second coils.

25. The system of claim 24, wherein said controller further comprises means for controlling the voltages on said first and second varactor diodes in a differential mode to effect magnetic field isolation adjustment and means for controlling the voltages on the first and second varactor diodes in a common mode to effect tuning.

26. A surface coil system capable of being operated in quadrature, comprising:

a first coil adapted to be positioned adjacent an anatomical region of interest for intercepting a magnetic field of a predetermined radio frequency generated by said region of interest;

a second coil adapted to be positioned adjacent said region of interest for intercepting said radio frequency magnetic field, said second coil positioned with respect to said first coil such that the net magnetization vectors corresponding to said first and second coil are at approximate right angles to each other;

a signal source operable to be selectively coupled to one of said first and second coils for inputting a test signal of said predetermined frequency;

a reflection impedance matching sensor operable to be consecutively coupled to each of said first and second coils and to said signal source for sensing the matching of impedance of said signal source to each of first and second coils;

an magnetic field isolation sensor operable to be coupled to said first and second coils for sensing the degree of magnetic field isolation of a signal on said first coil to a signal on said second coil;

a first variable capacitor and a second variable capacitor coupled to said first coil and a third variable capacitor coupled to said second coil; and a controller coupled to said reflection sensor, said magnetic field isolation sensor, and said first, second and third variable capacitors, said controller operable to vary the capacitance in said first, second and third variable capacitors to tune said first and second coils to said signal source, and to further optimize the magnetic field isolation of a signal at said predetermined frequency appearing on the first coil to that of a signal of said predetermined frequency appearing on said second coil.

27. The system of claim 26 wherein said first, second and third variable capacitors are varactor diodes.

28. The tunable magnetic resonance quadrature coil system of claim 1, wherein said first and second coils are flexible coils.

* * * * *